(12) United States Patent
Lin

(10) Patent No.: US 9,805,776 B2
(45) Date of Patent: Oct. 31, 2017

(54) MEMORY DEVICE, PERIPHERAL CIRCUIT THEREOF AND SINGLE-BYTE DATA WRITE METHOD THEREOF

(71) Applicant: eMemory Technology Inc., Hsinchu (TW)

(72) Inventor: Yih-Lang Lin, Taipei (TW)

(73) Assignee: eMemory Technology Inc., Hsinchu (TW)

(\*) Notice: Subject to any disclaimer, the term of this patent is extended or adjusted under 35 U.S.C. 154(b) by 0 days.

(21) Appl. No.: 15/381,089

(22) Filed: Dec. 15, 2016

(65) Prior Publication Data
US 2017/0206945 A1    Jul. 20, 2017

Related U.S. Application Data

(60) Provisional application No. 62/280,683, filed on Jan. 19, 2016.

(51) Int. Cl.
| | | |
|---|---|---|
| G11C 7/10 | (2006.01) | |
| G11C 7/22 | (2006.01) | |
| G11C 8/10 | (2006.01) | |
| G11C 7/06 | (2006.01) | |

(52) U.S. Cl.
CPC .............. *G11C 7/22* (2013.01); *G11C 7/065* (2013.01); *G11C 8/10* (2013.01)

(58) Field of Classification Search
CPC .............. G11C 7/22; G11C 7/065; G11C 8/10
USPC ...................................................... 365/189.05
See application file for complete search history.

(56) References Cited

U.S. PATENT DOCUMENTS

| | | | |
|---|---|---|---|
| 5,999,451 A | 12/1999 | Lin et al. | |
| 7,079,448 B2 | 7/2006 | Leconte et al. | |
| 8,441,862 B2 * | 5/2013 | Son ..................... | G11C 11/5628 365/185.03 |
| 9,076,534 B2 * | 7/2015 | Yoon .................. | G11C 16/3454 |
| 9,251,904 B2 * | 2/2016 | Kim ...................... | G11C 16/26 |

\* cited by examiner

*Primary Examiner* — Pho M Luu
(74) *Attorney, Agent, or Firm* — JCIPRNET

(57) ABSTRACT

A memory device, a peripheral circuit thereof and a single-byte data write method thereof are provided. The peripheral circuit includes a Y decoder, a page buffer, and a write circuit. The write circuit is coupled to a memory array and the page buffer through the Y decoder and receives a byte of program data. The write circuit is based on a memory address corresponding to the program data to receive a plurality of bytes of array data stored in the memory array through the Y decoder, and the read array data is written to page buffer through the Y decoder. Next, the program data is written to the memory array through the write circuit and Y decoder, and the array data is written to the memory array by the page buffer.

20 Claims, 5 Drawing Sheets

MEMORY DEVICE, PERIPHERAL CIRCUIT THEREOF AND SINGLE-BYTE DATA WRITE METHOD THEREOF

CROSS-REFERENCE TO RELATED APPLICATION

This application claims the priority benefit of U.S. provisional application Ser. No. 62/280,683, filed on Jan. 19, 2016. The entirety of the above-mentioned patent application is hereby incorporated by reference herein and made a part of this specification.

BACKGROUND OF THE INVENTION

1. Field of the Invention

The present invention relates to a memory device, and more particular, to a memory device, a peripheral circuit thereof and a single-byte data write method thereof.

2. Description of Related Art

Along with the rapid development of science and technology at the present, a non-volatile memory has been widely used in an electronic apparatus. The non-volatile memory, for example a flash memory, is used to store information for the electronic apparatus, and the importance of a non-volatile memory to an electrical apparatus is increasing. However, due to the limitation of a non-volatile memory semiconductor structure, data is written to a non-volatile memory by a page rather than by a single byte, thus the write performance is affected.

SUMMARY OF THE INVENTION

The invention provides a memory device, a peripheral circuit thereof and a single-byte data write method thereof, which can receive a single-byte of program data and refresh data of the memory array correspondingly.

The peripheral circuit of a memory device according to the present invention includes a Y decoder, a page buffer, a write circuit and a sense amplifier. The Y decoder is coupled to a memory array of the memory device. The page buffer is coupled to the memory array and the Y decoder. The write circuit is coupled to the memory array and the page buffer through the Y decoder and receives a byte of a program data. The sense amplifier is coupled between the Y decoder and the write circuit and reading a plurality of bytes of a array data stored by the memory array through the Y decoder to provide the read array data to the write circuit. The read array data is based on a memory address corresponding to the program data and the read array data is written to the page buffer through the Y decoder. Next, the program data is written to the memory array through the write circuit and the Y decoder, and the array data is written to the memory array by the page buffer.

A memory device in the present invention includes a memory array and the aforementioned peripheral circuit. The peripheral circuit is coupled to the memory array and receives a byte of a program data to write the program data to the memory array.

A single-byte data write method of a memory device in the present invention includes the following steps. A byte of a program data is received through a write circuit. A plurality of bytes of a array data stored by a memory array are read according to a memory address corresponding to the program data through a sense amplifier and a Y decoder and the array data is written to a page buffer through the write circuit and the Y decoder. The program data is written to the memory array through the write circuit and the Y decoder. The array data is written to the memory array through the page buffer.

In view of the above, in the embodiments of the invention, a memory device, a peripheral circuit thereof and a single-byte data write method thereof are provided. The unselected array data is read and then written to the page buffer by the write circuit. In addition, the selected program data is directly written to the memory array and the array data is written to the memory array through the page buffer. By this way, the data updating for a single-byte data in a one-page writing memory array can be realized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
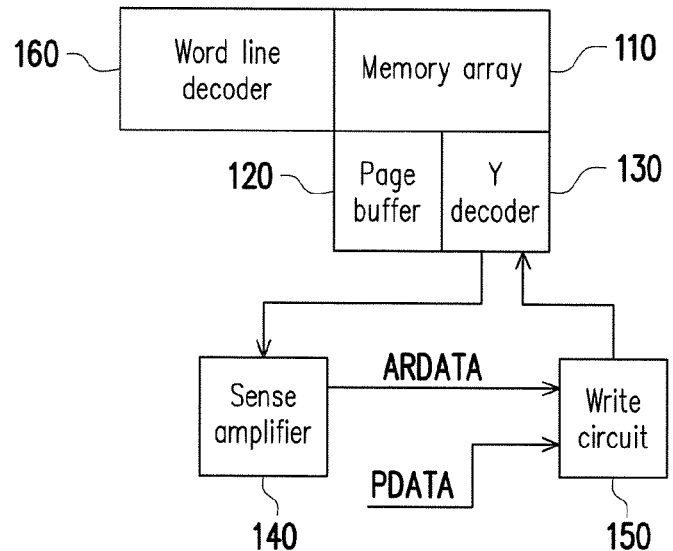
FIG. 1 is a schematic diagram showing a system of a memory device according to an embodiment of the present invention.

FIG. 1 is a schematic diagram showing a system of a memory device according to an embodiment of the invention. Please referring to FIG. 1, a memory device 100 in the present embodiment includes a memory array 110, a page buffer 120, a Y decoder 130, a sense amplifier 140, a write circuit 150 and a word line decoder 160, wherein the memory device 100 may be a non-volatile memory device and the memory array 110, for example, includes a plurality of memory cells arranged in an array (as described below), but the invention is not limited thereto. The page buffer 120, the Y decoder 130, the sense amplifier 140, the write circuit 150 and the word line decoder 160 may be viewed as a peripheral circuit which is coupled to the memory array 110 and receives a byte of program data PDATA from the outside to write the program data PDATA to the memory array 110.

The memory array 110 is coupled to the page buffer 120, the Y decoder 130 and the word line decoder 160, wherein the memory array 110, the page buffer 120 and the Y decoder 130 are coupled to each other. The sense amplifier 140 is coupled to the Y decoder 130 and the write circuit 150, and the write circuit 150 is coupled to the Y decoder 130.

The write circuit 150 receives the program data PDATA and the sense amplifier 140 is coupled to the memory array 110 through the Y decoder 130 to read a plurality of bytes of array data ARDATA stored by the memory array 110 according to a memory address corresponding to the program data PDATA, and to provide the read array data ARDATA to the write circuit 150.

Next, the write circuit 150 writes the read array data ARDATA to the page buffer 120 through the Y decoder 130 and then the program data PDATA is written to the memory array 110 through the write circuit 150 and the Y decoder 130, but the program data PDATA is not through the page buffer 120. The array data ARDATA is written to the memory array 110 by the page buffer 120 and does not cover the program data PDATA.

In this embodiment, the memory address includes a word line address and a bit line address, and the program data PDATA and the array data ARDATA are corresponding to the same word line address, for example. Generally speaking, one page means the memory cells in one word line. Furthermore, when the sense amplifier 140 reads the memory array 110, the word line decoder 160 may drive the memory array 110 according to the word line address of the memory address which is corresponding to the program data PDATA (i.e., the selected word line address) to enable the memory cells of an page in the memory array 110 (e.g., all memory cells in the same row for a control logic). Then, the bit line address increases gradually to make the sense amplifier 140 read the array data ARDATA stored in the memory cell of the page sequentially.

In this embodiment, when the write circuit 150 receives the array data ARDATA of the memory array 110 through the sense amplifier 140, the memory array 110 and the Y decoder 130 are turned on and the page buffer 120 is turned off; when the write circuit 150 writes the array data ARDATA to the page buffer 120, the page buffer 120 and the Y decoder 130 are turned on and the memory array 110 is turned off; when the write circuit 150 writes the program data PDATA to the memory array 110, the memory array 110, the page buffer 120 and the Y decoder 130 are turned on; when the array data ARDATA is written to the memory array 110 by the page buffer 120, the memory array 110 and the page buffer 120 are turned on and the Y decoder 130 is turned off.

In an embodiment of present invention, the array data ARDATA read by the sense amplifier 140 may include the stored data in the memory cells to which the program data PDATA is to be written or may not include the stored data in the memory cells to which the program data PDATA is to be written. After the write circuit 150 has written the array data ARDATA to the page buffer 120, the memory cells (i.e., one page) corresponding to the memory addresses of the program data PDATA and the array data ARDATA may be erased.

Figure 2:
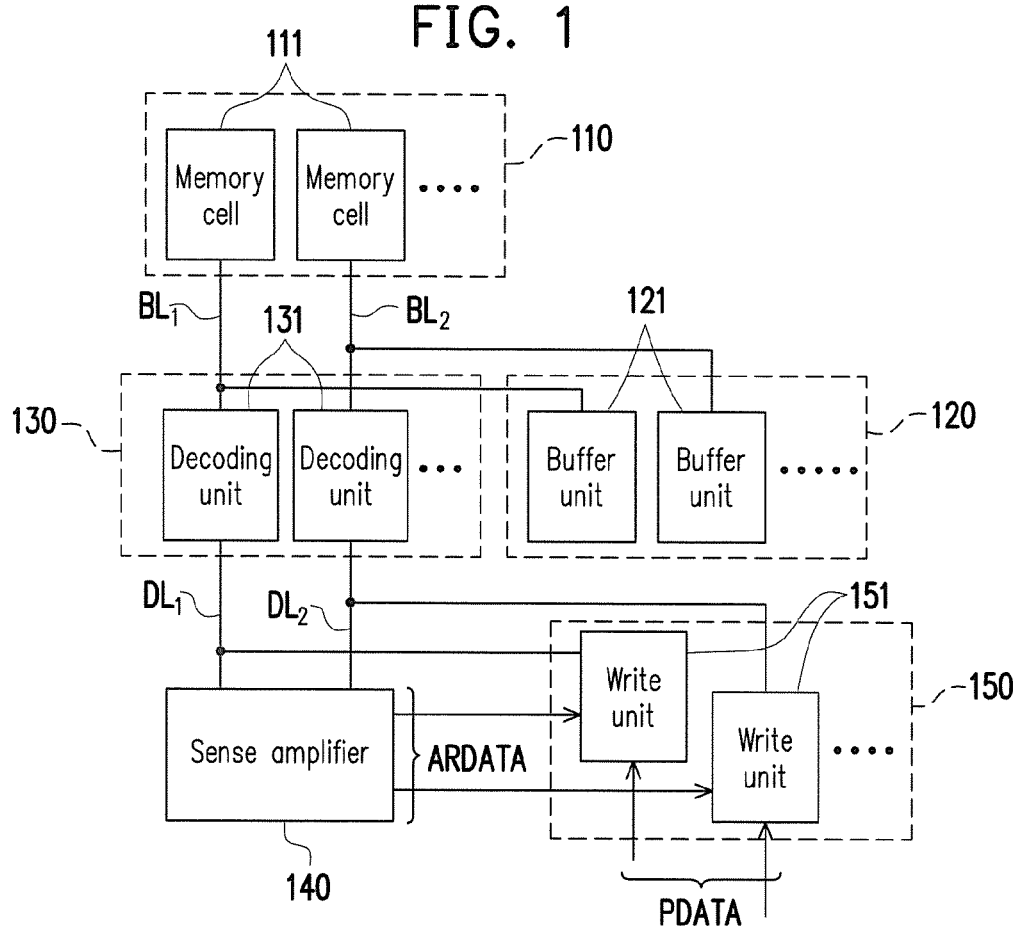
FIG. 2 is a schematic circuit view of a memory array, a Y decoder, a page buffer and a write circuit according to an embodiment of the invention.

FIG. 2 is a schematic circuit view of a memory array, a Y decoder, a page buffer and a write circuit according to an embodiment of the invention. Please referring to FIG. 1 and FIG. 2, wherein the same or similar elements use the same or similar labels. In the present embodiment, the memory array 110 includes a plurality of memory cells 111, the Y decoder 130 includes a plurality of decoding units 131, the page buffer 120 includes a plurality of buffer units 121, and the write circuit 150 has a plurality of write units 151.

In the present embodiment, the Y decoder 130 and the page buffer 120 are coupled to the memory array 110 through a plurality of bit lines ($BL_1$, $BL_2$, . . . ). In other words, each of the decoding units 131 and each of the buffer units 121 are coupled to the corresponding memory cell 111 through the corresponding bit line (such as $BL_1$, $BL^2$). Besides, the Y decoder 130 is coupled to the sense amplifier 140 and the write circuit 150 through a plurality of data lines ($DL_1$, $DL_2$, . . . ). In one embodiment, the PDATA is 8 bits, and the write circuit 150 has 8 write units 151, the sense amplifier 140 connected to $DL_1$ ~$DL_8$, thus sense amplifier send 8-bit ARDATA to write circuit 150 sequentially when the bit line address increase gradually.

Figure 3:
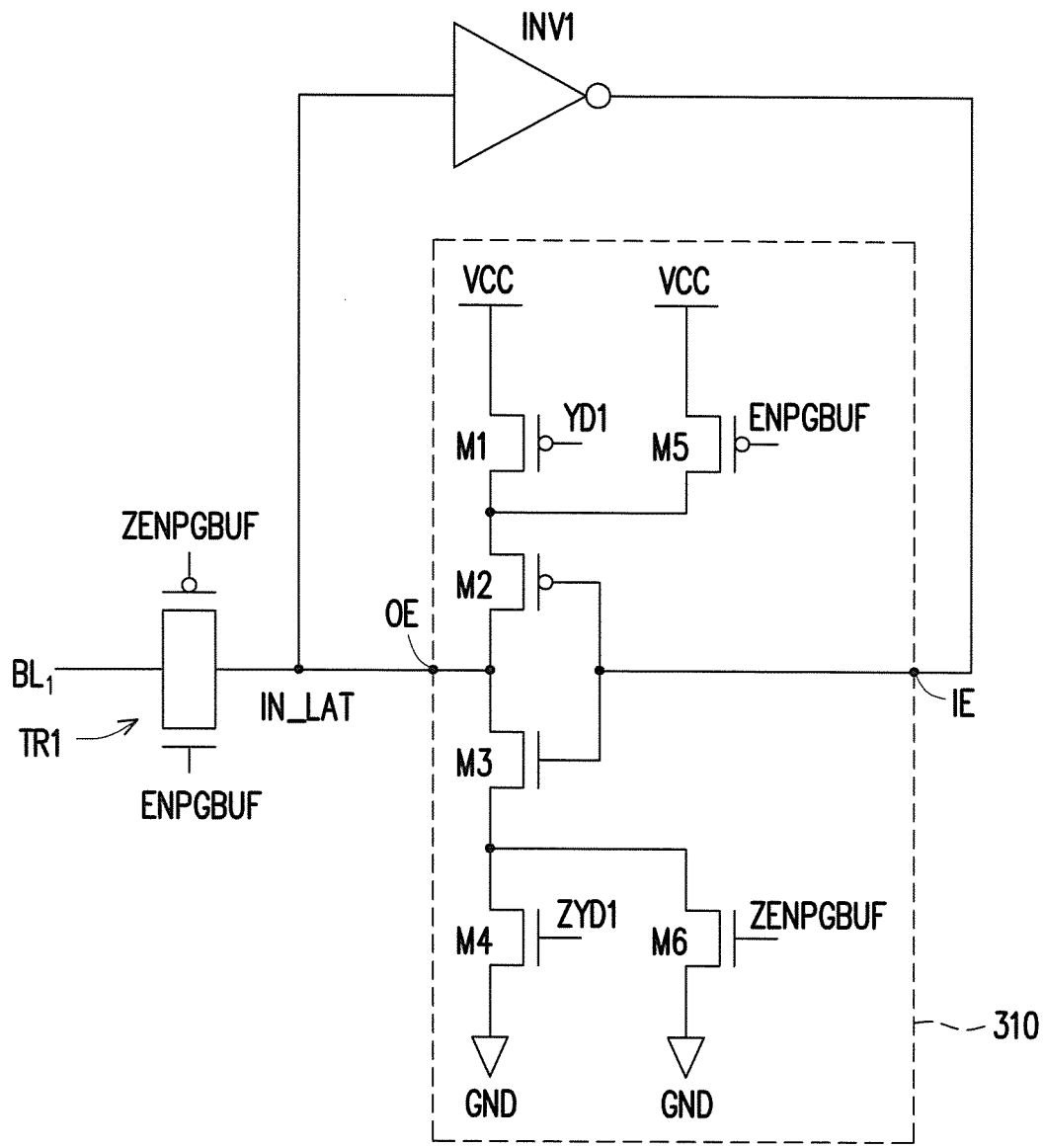
FIG. 3 is a schematic circuit diagram of a buffer unit according to an embodiment of the invention.

FIG. 3 is a schematic circuit diagram of a buffer unit according to an embodiment of the invention. Please referring to FIGS. 1-3, in the present embodiment, each buffer unit 121 includes a first transmission gate TR1, a first inverter INV1 and a tri-state inverter 310. The first end of the first transmission gate TR1 is coupled to the corresponding bit line $BL_1$, the second end of the first transmission gate TR1 is coupled to a internal latch node IN_LAT, the positive control end of the first transmission gate TR1 receives a page buffer enable signal ENPGBUF, and the negative control end of the first transmission gate TR1 receives an inverted page buffer enable signal ZENPGBUF. The input end of the first inverter INV1 is coupled to the internal latch node IN_LAT. An input end IE of the tri-state inverter 310 is coupled to the output end of the first inverter INV1 and an output end OE of the tri-state inverter 310 is coupled to the internal latch node IN_LAT, wherein the tri-state inverter 310 is controlled by the page buffer enable signal ENPGBUF, the inverted page buffer enable signal ZENPGBUF, a Y decode signal YD1 and an inverted Y decode signal ZYD1. The page buffer enable signal ENPGBUF and the inverted page buffer enable signal ZENPGBUF are complementary, and the Y decode signal YD1 and the inverted Y decode signal ZYD1 are complementary.

The tri-state inverter 310 includes transistors M1-M6 (corresponding to the first transistor to the sixth transistor). The source of the transistor M1 (corresponding to the first source/drain) receives a first reference voltage VCC and the gate of the transistor M1 (corresponding to the first gate) receives the Y decode signal YD1. The source of the transistor M2 (corresponding to the third source/drain) is coupled to the drain of the transistor M1 (corresponding to the second source/drain), the gate of the transistor M2 (corresponding to the second gate) is coupled to the input end IE of the tri-state inverter 310, and the drain of the transistor M2 (corresponding to the fourth source/drain) is coupled to the output end OE of the tri-state inverter 310.

The drain of the transistor M3 (corresponding to the fifth source/drain) is coupled to the output end OE of the tri-state inverter 310, the gate of the transistor M3 (corresponding to the third gate) is coupled to the input end IE of the tri-state inverter 310. The drain of the transistor M4 (corresponding to the seventh source/drain) is coupled to the source of the transistor M3 (corresponding to the sixth source/drain), the gate of the transistor M4 (corresponding to the fourth gate) receives the inverted Y decode signal ZYD1, and the source of the transistor M4 (corresponding to the eighth source/drain) receives a second reference voltage GND.

The source of the transistor M5 (corresponding to the ninth source/drain) receives the first reference voltage VCC, the gate of the transistor M5 (corresponding to the fifth gate) receives the page buffer enable signal ENPGBUF, and the drain of the transistor M5 (corresponding to the tenth source/drain) is coupled to the drain of the transistor M1. The drain of the transistor M6 (corresponding to the eleventh source/drain) is coupled to the source of the transistor M3 (corresponding to the sixth source/drain), the gate of the transistor M6 (corresponding to the sixth gate) receives the inverted page buffer enable signal ZENPGBUF, and the source of the transistor M6 (corresponding to the twelfth source/drain) receives the second reference voltage GND.

In the present embodiment, when the page buffer enable signal ENPGBUF is enabled (i.e., at a high voltage level) which means the inverted page buffer enable signal ZENPGBUF is disabled (i.e., at a low voltage level), the first transmission gate TR1 is turned on and the page buffer 120 is also turned on. On the contrary, when the page buffer enable signal ENPGBUF is disabled, the first transmission gate TR1 is turned off and the page buffer 120 is also turned off. Besides, when the Y decode signal YD1 and the page buffer enable signal ENPGBUF are both enabled (i.e., write circuit 150 write data to page buffer 120 or memory array 110), the data line $DL_1$ connects to the bit line $BL_1$, the bit line $BL_1$ connects to internal latch node IN_LAT, the transistors M1, M4-M6 are turned off, and the data on the bit line $BL_1$ can be easily written to the input end IE of the tri-state inverter 310; when the Y decode signal YD1 is disabled and the page buffer enable signal ENPGBUF is enabled (i.e., page buffer 120 write data to memory array 110), the data line $DL_1$ disconnects from the bit line $BL_1$, the bit line $BL_1$ connects to internal latch node IN_LAT, the transistors M1 and M4 are turned on, and the latched data will write to memory array 110 through the bit line $BL_1$; once the page buffer enable signal ENPGBUF is disabled, the bit line $BL_1$ disconnects from internal latch node IN_LAT, the transistors M5 and M6 are turned on, and the data is latched at the internal latch node IN_LAT in the buffer unit 121.

Figure 4:
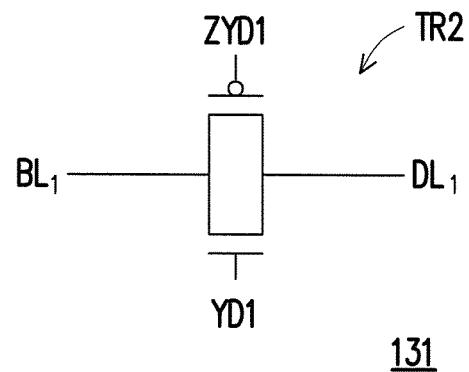
FIG. 4 is a schematic circuit diagram of a decoding unit according to an embodiment of the invention.

FIG. 4 is a schematic circuit diagram of a decoding unit according to an embodiment of the invention. With reference to FIG. 1, FIG. 2, and FIG. 4, in this embodiment, a decoding unit 131 includes a second transmission gate TR2. The first end of the second transmission gate TR2 is coupled to the corresponding bit line $BL_1$, the second end of the second transmission gate TR2 is coupled to the corresponding data line $DL_1$, the positive control end of the second transmission gate TR2 receives the Y decode signal YD1, and the negative control end of the second transmission gate TR2 receives the inverted Y decode signal ZYD1. When the Y decode signal YD1 is enabled (i.e., at a high voltage level) which means the inverted Y decode signal ZYD1 is disabled (i.e., at a low voltage level), the second transmission gate TR2 is turned on and the Y decoder 130 is also turned on. On the contrary, when the Y decode signal YD1 is disabled, the second transmission gate TR2 is turned off and the Y decoder 130 is also turned off. In an embodiment of the invention, there are M bytes in one page, the number N of the bit lines (such as $BL_1$, $BL_2$) is 8 times of M (i.e. N=8×M). Thus, one data line (such as $DL_1$, $DL_2$, . . . ) connects to M Decoding units 131. And, the bit lines will be $BL_1 \sim BL_N$, the Y decode signals will be YD1~YDN, and the inverted Y decode signals will be ZYD1~ZYDN.

In an embodiment of the invention, each of bit lines corresponds to a Y decode signal (such as YD1~YDN) and an inverted Y decode signal (such as ZYD1~ZYDN), and the decode signals (such as YD1~YDN) may be partially enabled, partially disabled, simultaneously enabled or simultaneously disabled. The first transmission gates (such as TR1) of the the page units (such as 121 or 300) are received the same page buffer enable signal (such as ENPGBUF) and the same inverted page buffer enable signal (such as ZENPGBUF), i.e. the page buffer enable signals (such as ENPGBUF) received by the page units (such as 121 or 300) are simultaneously enabled or simultaneously disabled.

In an embodiment of the invention, the memory array 110 only performs a page erase operation or a page program operation, i.e. the memory cells (such as 111) in the same word line are simultaneously erased or simultaneously programmed. When a byte write scheme is performing (i.e. writing the program data PDATA into the memory array 110), the Y decode signals (such as YD1~YDN) corresponding to the bit lines (such as $BL_1 \sim BL_N$) for transmitting the program data PDATA are enabled, the other Y decode signals (such as YD1~YDN) are disabled, and the page buffer enable signal (such as ENPGBUF) is enabled. Therefore, the program data PDATA is written to the memory array 110 through the write circuit 150 and the Y decoder 130 while the array data ARDATA is written to the memory array 110 by the page buffer 120.

Figure 5:
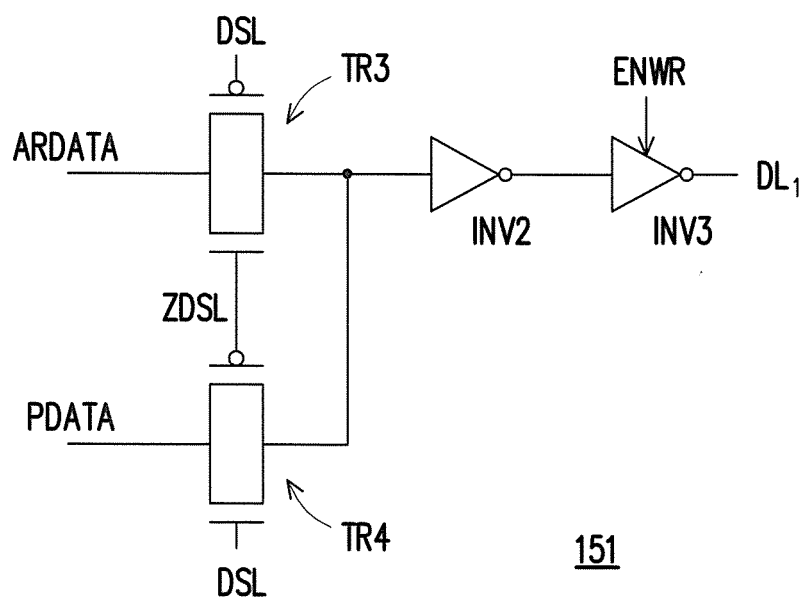
FIG. 5 is a schematic circuit diagram of a write unit according to an embodiment of the invention.

FIG. 5 is a schematic circuit diagram of a write unit according to an embodiment of the invention. Referring to FIGS. 1, 2 and 4, in the present embodiment, each writing unit 151 includes a third transmission gate TR3, a fourth transmission gate TR4, a second inverter INV2 and a third inverter INV3. The first end of the third transmission gate TR3 receives the array data ARDATA, the positive control end of the third transmission gate TR3 receives an inverted data selection signal ZDSL, and the negative control end of the third transmission gate TR3 receives a data selection signal DSL.

The first end of the fourth transmission gate TR4 receives the program data PDATA, the second end of the fourth transmission gate TR4 is coupled to the second end of the third transmission gate TR3, the positive control end of the fourth transmission gate TR4 receives the data selection signal DSL, and the negative control end of the third transmission gate TR3 receives the inverted data selection signal ZDSL. The input end of the second inverter INV2 is coupled to the second end of the third transmission gate TR3. The input end of the third inverter INV3 is coupled to the output end of the second inverter INV2 and the output end of the third inverter INV3 is coupled to the corresponding data line $DL_1$, and the control end of the third inverter INV3 receives a write enable signal ENWR.

In the present embodiment, when the data selection signal DSL is enabled (i.e., at a high voltage level) which means the inverted data selection signal ZDSL is disabled (i.e., at a low voltage level), the fourth transmission gate TR4 is turned on, the third transmission gate TR3 is turned off, and it also means the program data PDATA is provided to the second inverter INV2. On the contrary, when the data selection signal DSL is disabled, the third transmission gate TR3 is turned on, the fourth transmission gate TR4 is turned off, and it also means the array data ARDATA is provided to the second inverter INV2.

Figure 6:
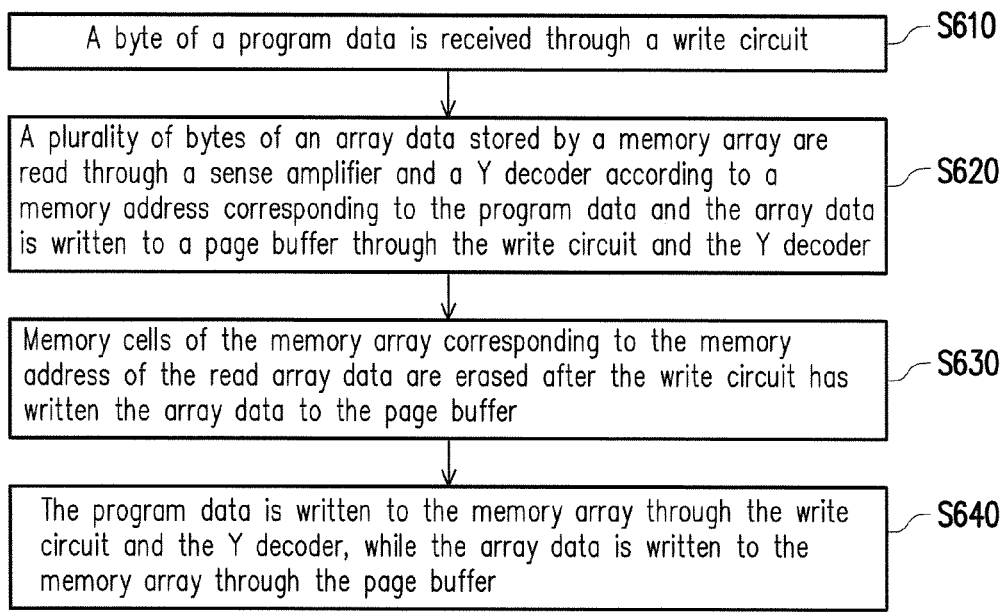
FIG. 6 is a flow diagram illustrating a single-byte data write method of a memory device according to an embodiment of the invention.

FIG. 6 is a flow diagram illustrating a single-byte data write method of a memory device according to an embodiment of the invention. Referring to FIG. 6, a single-byte data write method comprises the following steps. In step S610, a byte of a program data is received through a write circuit. In step S620, a plurality of bytes of an array data stored by a memory array are read through a sense amplifier and a Y decoder according to a memory address corresponding to the program data and the array data is written to a page buffer through the write circuit and the Y decoder. Next, in step S630, memory cells of the memory array corresponding to the memory address of the read array data are erased after the write circuit has written the array data to the page buffer. In step S640, the program data is written to the memory array through the write circuit and the Y decoder. In the same time, the array data is written to the memory array through the page buffer.

Figure 7:
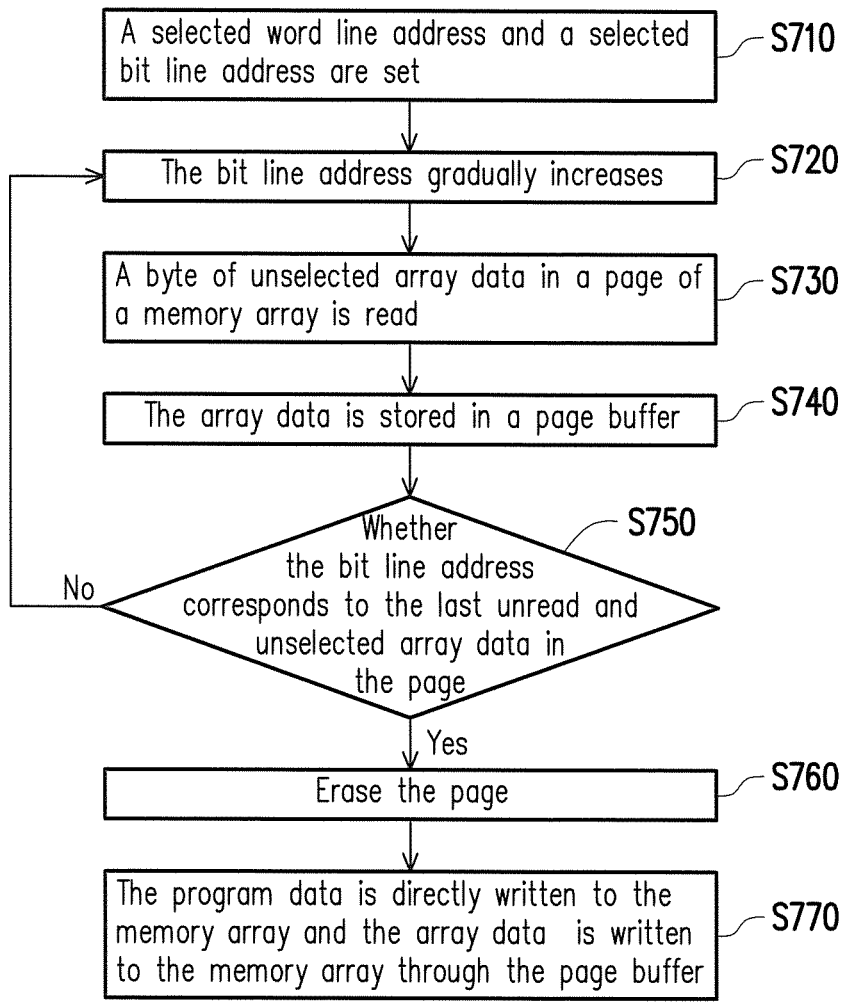
FIG. 7 is a flow diagram illustrating a single-byte data write method of a memory device according to another embodiment of the invention.

FIG. 7 is a flow diagram illustrating a single-byte data write method of a memory device according to another embodiment of the invention. Referring to FIG. 7, a single-byte data write method of the present embodiment comprises the following steps. In step S710, a selected word line address and a selected bit line address are set. In step S720, the bit line address gradually increases. In step S730, a byte of unselected array data in a page of a memory array is read. Next, in step S740, the array data is stored in a page buffer.

In step S750, it is determined whether the bit line address corresponds to the last unread and unselected array data in the page. When the bit line address doesn't correspond to the last unread and unselected array data in the page that means the result of the judgment at step S750 is "NO", the process returns to step S720. Otherwise, when the bit line address corresponds to the last unread and unselected array data in the page, the result of the judgment at step S750 is "YES", the reading of the array data is stopped and then step S760 is executed.

In step S760, the page is erased. Finally, in step S770, the program data (i.e., the selected data) is directly written to the memory array to refresh the stored data in the page and the array data (i.e., the unselected data) is written to the memory array through the page buffer to rewrite the stored data in the page.

The sequence of aforementioned steps S610, S620, S630, S640, S710, S720, S730, S740, S750, S760 and S770 is used to describe the present invention, and the invention is not intended to limit thereto. Besides, the detail of aforementioned steps S610, S620, S630, S640, S710, S720, S730, S740, S750, S760 and S770 may be deduced by analogy according to the exemplary embodiments depicted in FIG. 1 to FIG. 5, and therefore description is omitted here.

In an embodiment of the invention, assume the size of a page is M bytes, and the single-byte data write method may be counted from 1 to M, i.e. the array data in the page are read byte by byte, so as to determine whether the reading of the array data is performed. In other words, the reading of the array data is performed when the count result is smaller than M, and the reading of the array data is stopped when the count result is equal to or greater than M. Wherein, M is an integer, the reading of the array data are referred to the steps S720 to S750 of FIG. 7, and therefore description is omitted here.

In summary, the embodiments of the invention provide a memory device, a peripheral circuit thereof and a single-byte data write method thereof. The write circuit receives an unselected array data and writes the unselected array to a page buffer. A selected program data is directly written to a memory array and the array data is written to the memory array through the page buffer. By this way, the data refreshment for a single-byte data in a one-page writing memory array can be realized.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A peripheral circuit of a memory device, comprising:
   a Y decoder, coupled to a memory array of the memory device;
   a page buffer, coupled to the memory array and the Y decoder;
   a write circuit, coupled to the memory array and the page buffer through the Y decoder and receiving a byte of a program data; and
   a sense amplifier coupled between the Y decoder and the write circuit, reading a plurality of bytes of a array data stored by the memory array through the Y decoder to provide the read array data to the write circuit;
   wherein the read array data is based on a memory address corresponding to the program data, the read array data is written to the page buffer through the Y decoder, the program data is written to the memory array through the write circuit and the Y decoder, and the array data is written to the memory array by the page buffer.

2. The peripheral circuit as claimed in claim 1, wherein the memory address comprises a word line address and a bit line address, and the program data and the array data correspond to the same word line address.

3. The peripheral circuit as claimed in claim 2, further comprising a word line decoder which drives the memory array according to the word line address.

4. The peripheral circuit as claimed in claim 1, wherein the memory array comprises a plurality of memory cells and the memory cells corresponding to the memory address and the memory cells corresponding to the array data are erased after the write circuit has written the array data to the page buffer.

5. The peripheral circuit as claimed in claim 1, wherein the Y decoder and the page buffer are coupled to the memory array through a plurality of bit lines.

6. The peripheral circuit as claimed in claim 5, wherein the memory array comprises a plurality of memory cells, the Y decoder comprises a plurality of decoding units and the page buffer comprises a plurality of buffer units, wherein each of the decoding units and each of the buffer units are coupled to the corresponding one of memory cells through the corresponding one of bit lines.

7. The peripheral circuit as claimed in claim 6, wherein each of the buffer units comprises:
   a first transmission gate, has a first end coupled to the corresponding bit line, a second end coupled to a internal latch node, a positive control end receiving a page buffer enable signal and a negative control end receiving an inverted page buffer enable signal;
   a first inverter, has an input end coupled to the internal latch node and an output end;
   a tri-state inverter, has an input end coupled to the output end of the first inverter, and an output end coupled to the internal latch node, wherein the tri-state inverter is controlled by the page buffer enable signal and a Y decode signal.

8. The peripheral circuit as claimed in claim 7, wherein the tri-state inverter comprises:
   a first transistor, has a first source/drain receiving a first reference voltage, a first gate receiving the Y decode signal, and a second source/drain;
   a second transistor, has a third source/drain coupled to the second source/drain, a second gate coupled to the input end, and a fourth source/drain coupled to the output end;
   a third transistor, has a fifth source/drain coupled to the output end, a third gate coupled to the input end and a sixth source/drain;
   a fourth transistor, has a seventh source/drain coupled to the sixth source/drain, a fourth gate receiving an inverted Y decode signal, and a eighth source/drain receiving a second reference voltage;

a fifth transistor, has a ninth source/drain receiving the first reference voltage, a fifth gate receiving the page buffer enable signal, and a tenth source/drain coupled to the second source/drain; and a sixth transistor, has a eleventh source/drain coupled to the sixth source/drain, a sixth gate receiving the inverted page buffer enable signal, and a twelfth source/drain receiving the second reference voltage.

9. The peripheral circuit as claimed in claim 8, wherein the Y decoder is coupled to the write circuit through a plurality of data lines.

10. The peripheral circuit as claimed in claim 9, wherein each of the decoding units comprises:

a second transmission gate, has a first end coupled to the corresponding bit line, a second end coupled to the corresponding data line, a positive control end receiving the Y decode signal and a negative control end receiving the inverted Y decode signal.

11. The peripheral circuit as claimed in claim 9, wherein the write circuit comprises a plurality of write units and each of the write units comprises:

a third transmission gate, has a first end receiving the array data, a second end, a positive control end receiving an inverted data selection signal and a negative control end receiving a data selection signal;

a fourth transmission gate, has a first end receiving the program data, a second end coupled to the second end of the third transmission gate, a positive control end receiving the data selection signal and a negative control end receiving the inverted data selection signal;

a second inverter, has a input end coupled to the second end of the third transmission gate and a output end; and a third inverter, has a input end coupled to the output end of the second inverter, a output end coupled to the corresponding data line; and a control end receiving a write enable signal.

12. The peripheral circuit as claimed in claim 1, wherein the memory array and the Y decoder are turned on and the page buffer is turned off when the sense amplifier reads the array data of the memory array, the Y decoder and the page buffer are turned on and the memory array is turned off when the write circuit writes the array data to the page buffer, the memory array, the page buffer and the Y decoder are turned on, when the write circuit writes the program data to the memory array, and the memory array and the page buffer are turned on and the Y decoder is turned off when the array data is written to the memory array by the page buffer.

13. A memory device, comprising:
a memory array; and
a peripheral circuit as claimed in claim 1, coupled to the memory array and receiving a byte of a program data to write the program data to the memory array.

14. A single-byte data write method of a memory device, comprising:

receiving a byte of a program data through a write circuit;
reading a plurality of bytes of a array data stored by a memory array according to a memory address corresponding to the program data through a sense amplifier and a Y decoder and writing the array data to a page buffer through the write circuit and the Y decoder;
writing the program data to the memory array through the write circuit and the Y decoder; and
writing the array data to the memory array through the page buffer.

15. The single-byte data write method as claimed in claim 14, wherein the memory address comprises a word line address and a bit line address and the program data and the array data correspond to the same word line address.

16. The single-byte data write method as claimed in claim 14, wherein the memory array comprises a plurality of memory cells and the single-byte data write method further comprises:

erasing the memory cells corresponding to the memory address and the memory cells corresponding to the array data after the write circuit has write the array data to the page buffer.

17. The single-byte data write method as claimed in claim 14, further comprising:

turning on the memory array and the Y decoder and turning off the page buffer when the sense amplifier reads the array data of the memory array;
turning on the Y decoder and the page buffer and turning off the memory array when the write circuit writes the array data to the page buffer;
turning on the memory array, the page buffer and the Y decoder when the write circuit writes the program data to the memory array; and
turning on the memory array and the page buffer and turning off the Y decoder when the array data is written to the memory array by the page buffer.

18. The single-byte data write method as claimed in claim 14, wherein writing the program data to the memory array through the write circuit and the Y decoder while writing the array data to the memory array through the page buffer.

19. The single-byte data write method as claimed in claim 14, wherein the step of reading the bytes of the array data stored by the memory array according to the memory address corresponding to the program data through the sense amplifier and the Y decoder and writing the array data to a page buffer through the write circuit and the Y decoder comprises:

A) setting a word line address and a bit line address corresponding to the memory address of the program data;
B) increasing the bit line address gradually;
C) reading a byte of the array data in a page of the memory array according to the increased bit line address through the sense amplifier and the Y decoder;
D) writing the read array data into the page buffer through the write circuit and the Y decoder;
E) when the increased bit line address is not corresponded to the last unread array data in the page, repeating the steps B to E, wherein the last unread array data is not corresponded to the bit line address of the memory address; and
F) when the increased bit line address is corresponded to the last unread array data in the page, stopping the reading of the array data.

20. The single-byte data write method as claimed in claim 14, wherein a size of a page in the memory array is M bytes, and the step of reading the bytes of the array data stored by the memory array according to the memory address corresponding to the program data comprises:

counting from 1 to M to generate a count result, wherein M is an integer;
reading a byte of the array data when the count result is smaller than M; and
stopping the reading of the array data when the count result is equal to M.

* * * * *